(12) United States Patent
Kim

(10) Patent No.: US 9,502,342 B2
(45) Date of Patent: Nov. 22, 2016

(54) SEMICONDUCTOR PACKAGE AND METHOD OF FABRICATING THE SAME

(71) Applicant: Samsung Electronics Co., Ltd., Suwon-si (KR)

(72) Inventor: Ilho Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/801,110

(22) Filed: Jul. 16, 2015

(65) Prior Publication Data

US 2016/0111396 A1    Apr. 21, 2016

(30) Foreign Application Priority Data

Oct. 15, 2014  (KR) .................. 10-2014-0139193

(51) Int. Cl.
| | |
|---|---|
| *H01L 25/065* | (2006.01) |
| *H01L 21/48* | (2006.01) |
| *H01L 23/31* | (2006.01) |
| *H01L 23/498* | (2006.01) |

(Continued)

(52) U.S. Cl.
CPC ....... *H01L 23/49838* (2013.01); *H01L 21/565* (2013.01); *H01L 23/3114* (2013.01); *H01L 23/42* (2013.01); *H01L 23/49816* (2013.01); *H01L 24/97* (2013.01); *H01L 25/105* (2013.01); *H01L 25/50* (2013.01); *H01L 24/16* (2013.01); *H01L 24/32* (2013.01); *H01L 24/48* (2013.01); *H01L 24/73* (2013.01); *H01L 2224/16227* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2225/1023* (2013.01); *H01L 2225/1058* (2013.01); *H01L 2225/1094* (2013.01); *H01L 2924/15311* (2013.01); *H01L 2924/15331* (2013.01); *H01L 2924/18161* (2013.01)

(58) Field of Classification Search
CPC ............ H01L 23/49838; H01L 23/36; H01L 23/49827; H01L 21/565; H01L 21/4882; H01L 21/486; H01L 24/32; H01L 24/16; H01L 24/73; H01L 24/48; H01L 24/97; H01L 25/105; H01L 25/50; H01L 25/0657
USPC ........ 438/107, 109, 121, 122, 125; 257/686, 257/704–707, 712, 772, 777
See application file for complete search history.

(56) References Cited

U.S. PATENT DOCUMENTS

| | | | |
|---|---|---|---|
| 6,407,459 | B2 | 6/2002 | Kwon |
| 6,767,765 | B2 | 7/2004 | Chiu |

(Continued)

FOREIGN PATENT DOCUMENTS

| | | |
|---|---|---|
| KR | 2007062087 | 6/2007 |
| KR | 101089580 | 12/2011 |

*Primary Examiner* — Davienne Monbleau
*Assistant Examiner* — Changhyun Yi
(74) *Attorney, Agent, or Firm* — Onello & Mello, LLP

(57) ABSTRACT

A method of fabricating a package-on-package (PoP) type of semiconductor package may include providing a lower package with a lower substrate, a lower semiconductor chip, and a lower mold layer and providing an upper package with an upper substrate, an upper semiconductor chip, and an upper mold layer. A through hole is formed to penetrate the upper package, and the upper package and lower package are electrically connected. A thermal interface material is injected into the through hole to form a first heat transmission part between, and in contact with, the upper package and the lower package.

14 Claims, 11 Drawing Sheets

(51) Int. Cl.
*H01L 25/00* (2006.01)
*H01L 21/56* (2006.01)
*H01L 25/10* (2006.01)
*H01L 23/42* (2006.01)
*H01L 23/00* (2006.01)

(56) References Cited

U.S. PATENT DOCUMENTS

| | | | |
|---|---|---|---|
| 7,002,805 B2 | 2/2006 | Lee et al. | |
| 7,015,577 B2 | 3/2006 | Wang | |
| 7,211,889 B2 | 5/2007 | Shim | |
| 7,317,247 B2 | 1/2008 | Lee et al. | |
| 7,319,051 B2 | 1/2008 | Cheah et al. | |
| 7,960,827 B1 | 6/2011 | Miller, Jr. et al. | |
| 8,115,301 B2 | 2/2012 | Kim et al. | |
| 8,574,965 B2 | 11/2013 | Refai-Ahmed et al. | |
| 2003/0183909 A1* | 10/2003 | Chiu | H01L 23/04 257/667 |
| 2008/0203552 A1 | 8/2008 | Kim et al. | |
| 2011/0316159 A1* | 12/2011 | Kang et al. | H01L 25/0657 257/741 |
| 2013/0200524 A1* | 8/2013 | Han et al. | H01L 23/49833 257/774 |
| 2015/0179618 A1* | 6/2015 | Jeong | H01L 25/105 257/738 |
| 2016/0056079 A1* | 2/2016 | Kim et al. | H01L 21/4853 438/113 |

\* cited by examiner

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0139193, filed on Oct. 15, 2014, in the Korean Intellectual Property Office, the entire content of which is hereby incorporated by reference.

BACKGROUND

Example embodiments of the inventive concepts relate to a package-on-package (PoP) type of semiconductor package, and in particular, to a PoP type of semiconductor package including a heat transmission feature configured to exhaust heat generated from a lower package, and methods of fabrication thereof.

High-performance, high-speed and compact electronic systems continue to enjoy ever-increasing demand as the electronic industry matures. Various semiconductor package techniques have been proposed to meet such a demand. For example, a semiconductor package device may be configured to include a plurality of semiconductor chips mounted on a package substrate, referred to in industry as a package-on-package (PoP) structure. For the PoP structure, a semiconductor chip and a package substrate are provided in each of stacked packages. In such package systems, thermal transmission can be a challenge.

SUMMARY

Example embodiments of the inventive concepts provide a semiconductor package with improved thermal characteristics.

Other example embodiments of the inventive concepts provide a fabrication method capable of increasing a production yield of a semiconductor package through a relatively simplified process.

According to example embodiments of the inventive concepts, a method of fabricating a semiconductor package may include: providing a lower package with a lower substrate, a lower semiconductor chip, and a lower mold layer; providing an upper package with an upper substrate, an upper semiconductor chip, and an upper mold layer; forming a through hole to penetrate the upper package, electrically connecting the upper package to the lower package; and injecting a thermal interface material into the through hole to form a first heat transmission part between, and in contact with, the upper package and the lower package.

In example embodiments, the injecting of the thermal interface material may further include forming a second heat transmission part extending from the first heat transmission part to fill the through hole.

In example embodiments, the forming of the through hole may be performed using a laser drilling process or a mechanical drilling process.

In example embodiments, the injecting of the thermal interface material may include applying pressure to the thermal interface material.

In example embodiments, the electrically connecting of the upper package to the lower package may include forming connection members to connect the upper substrate to the lower substrate, without bending of the upper or lower package.

In example embodiments, the first heat transmission part may be formed to fill a gap between the upper package and the lower semiconductor chip.

In example embodiments, the first heat transmission part may be formed to be in contact with the upper package and the lower package.

In example embodiments, the lower mold layer may be formed to cover a side surface of the lower semiconductor chip and may have a top surface substantially coplanar with that of the lower semiconductor chip. The first heat transmission part may be formed to cover at least a portion of the top surface of the lower semiconductor chip.

In example embodiments, the through hole may be formed at a position that is laterally spaced apart from an edge of the upper package in plan view.

In example embodiments, the through hole may be formed above the lower semiconductor chip in plan view.

In example embodiments, the preparing of the upper package may include mounting the upper semiconductor chip on the upper substrate. The through hole may be formed spaced apart from the upper semiconductor chip.

In example embodiments, the upper semiconductor chip may include first and second upper semiconductor chips spaced apart from each other, and the through hole may be formed between the first and second upper semiconductor chips.

In example embodiments, the through hole may include first and second through holes arranged parallel to opposite side surfaces of the first and second upper semiconductor chips.

According to example embodiments of the inventive concepts, a semiconductor package may include: a lower package including a lower substrate, a lower semiconductor chip, and a lower mold layer; an upper package on the lower package to include an upper substrate, an upper semiconductor chip, and an upper mold layer, connection members connecting the lower substrate electrically to the upper substrate, and a first heat transmission part interposed between the lower package and the upper package. The upper package may include a through hole penetrating the upper substrate and the upper mold layer.

In example embodiments, the semiconductor package may further include a second heat transmission part extending from the first heat transmission part to fill the through hole.

In example embodiments, the first heat transmission part may contact the lower package and the upper package.

In example embodiments, the lower mold layer may cover a side surface of the lower semiconductor chip and have a top surface substantially coplanar with that of the lower semiconductor chip. The first heat transmission part may cover a portion of the top surface of the lower semiconductor chip.

In example embodiments, the through hole may be above the lower semiconductor chip in plan view.

In example embodiments, the through hole may be spaced apart from the upper semiconductor chip in plan view.

In example embodiments, the upper semiconductor chip may include first and second upper semiconductor chips spaced apart from each other, and the through hole may be located between the first and second upper semiconductor chips.

According to example embodiments of the inventive concepts, a method of fabricating a semiconductor package comprises: providing a lower package with a lower substrate, a lower semiconductor chip, and a lower mold layer; providing an upper package with an upper substrate, an upper semiconductor chip, and an upper mold layer; forming a through hole through the upper package; positioning the upper package on the lower package with connection members between electrical contacts of the upper package and electrical contacts of the lower package, the connection members being of a height to form a void between a lowermost surface of the upper mold layer of the upper package and an uppermost surface of at least one of the lower semiconductor chip or lower mold layer of the lower package, the void extending in an horizontal direction between the lower package and upper package; and after positioning the upper package on the lower package, injecting a thermal interface material into the through hole to form a first heat transmission part in the void in contact with the lower package and upper package.

In example embodiments, injecting the thermal interface material further fills the through hole with thermal interface material.

In example embodiments, the upper semiconductor chip comprises first and second upper semiconductor chips and wherein the through hole is between, and laterally spaced apart from the first and second upper semiconductor chips.

In example embodiments, the through hole is above the lower semiconductor chip.

In example embodiments, the through hole comprises multiple through holes.

In example embodiments, the lower mold layer surrounds, in a lateral direction, the lower semiconductor chip and surrounds, in a lateral direction, the connection members.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
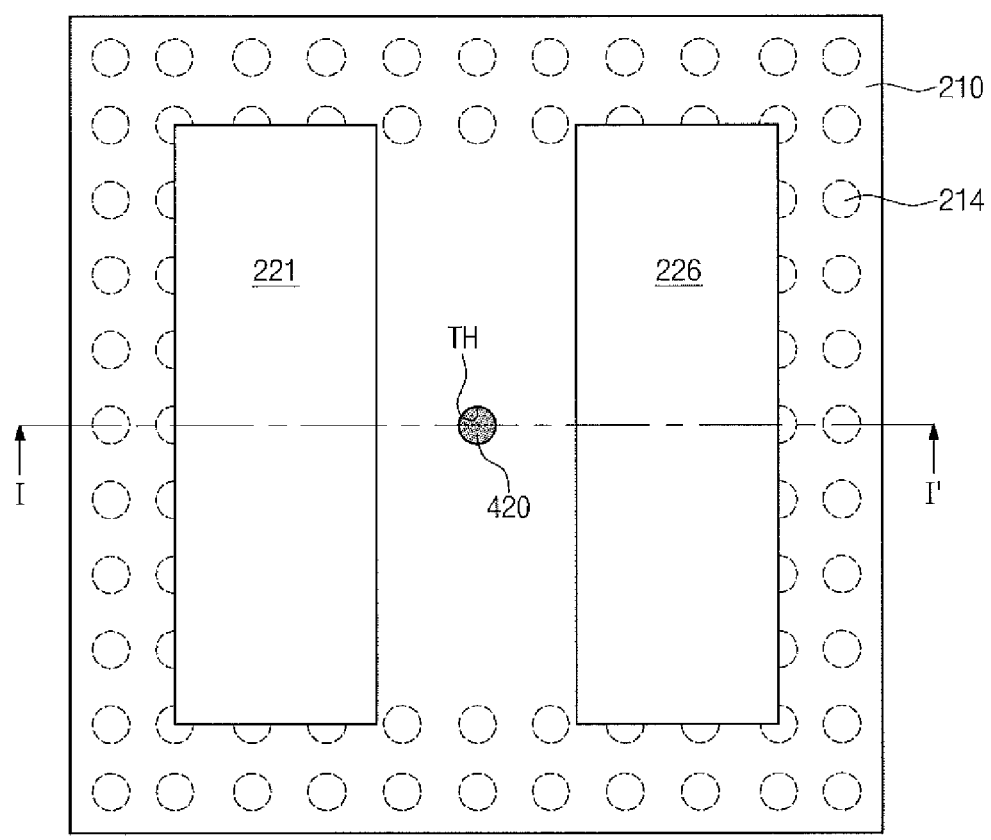
FIG. 1 is a plan view illustrating a semiconductor package according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
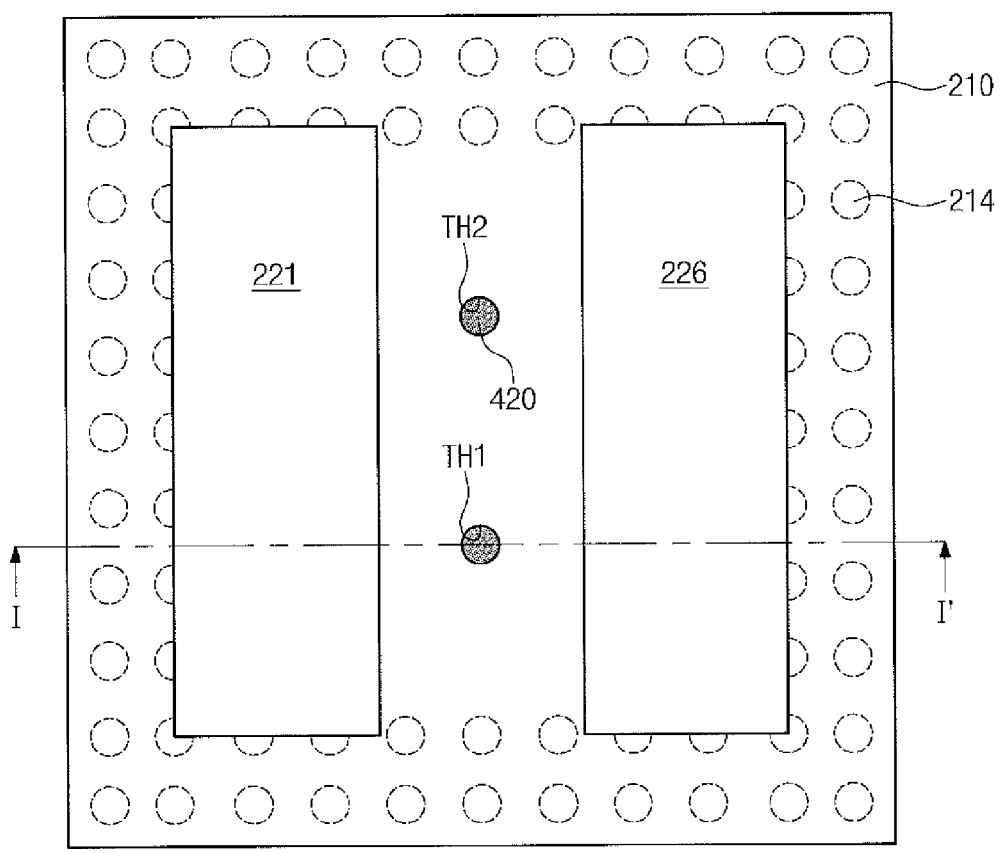
FIG. 2 is a plan view illustrating a semiconductor package according to other example embodiments of the inventive concepts.
Figure 3:
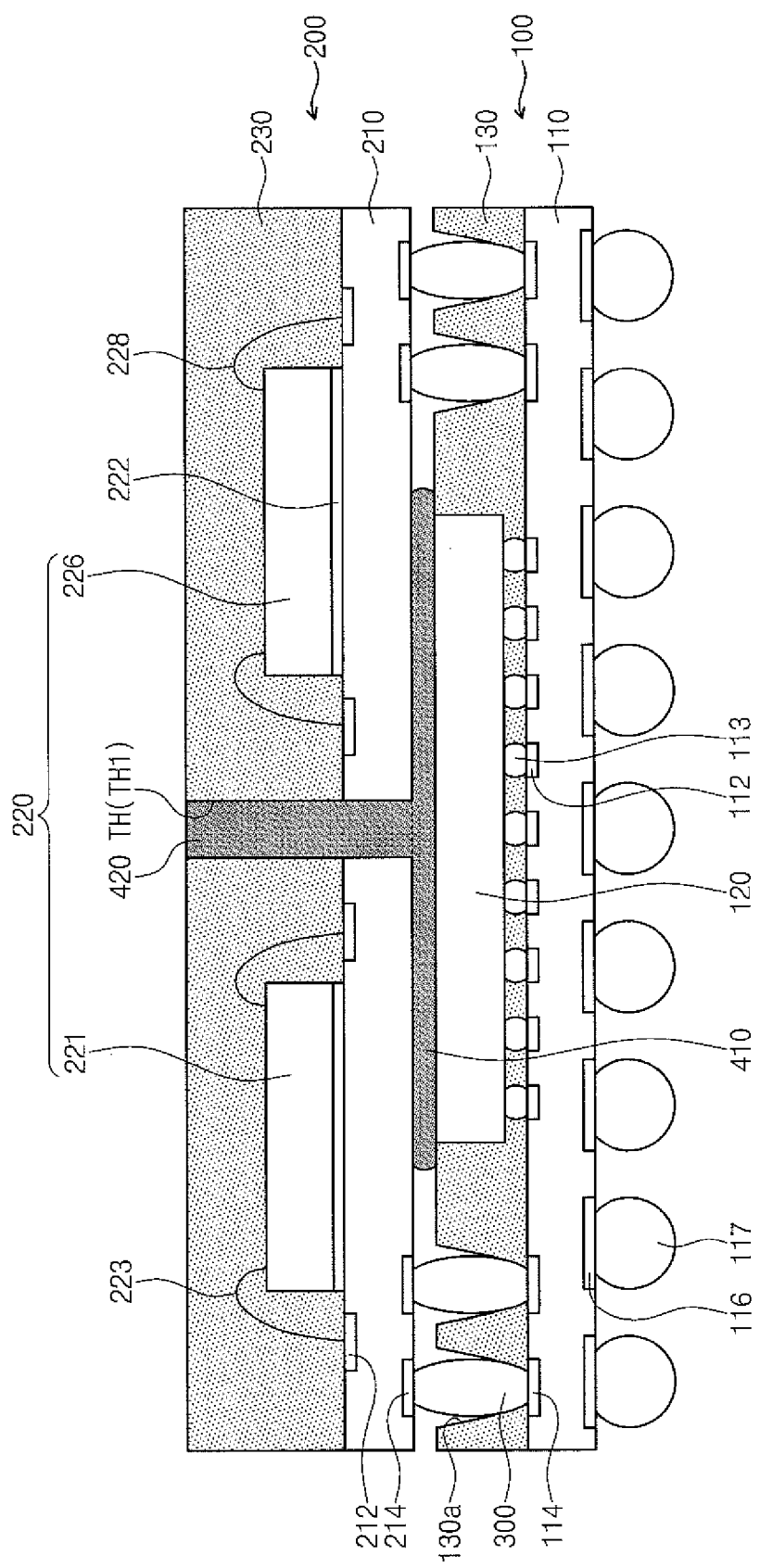
FIG. 3 is a sectional view taken along line I-I' of FIG. 1 or 2.

FIGS. 1 and 2 are plan views illustrating semiconductor packages according to example embodiments of the inventive concepts. FIG. 3 is a cross-sectional view taken along line I-I' of FIG. 1 or 2.

Referring to FIGS. 1 and 3, in some embodiments, a semiconductor package may include a lower package 100, an upper package 200, connection members 300, a first heat transmission part 410, and a second heat transmission part 420.

In some embodiments, the lower package 100 may include a lower substrate 110, a lower semiconductor chip 120, and a lower mold layer 130.

In some embodiments, the lower substrate 110 may include lower chip pads 112, lower connection pads 114, and outer connection pads 116. The lower chip pads 112 may be disposed at a central, or intermediate, region of a top surface of the lower substrate 110, and lower chip bumps 113 may be provided on the lower chip pads 112, respectively. The lower connection pads 114 may be disposed on an edge, or outer, region of the top surface of the lower substrate 110. The outer connection pads 116 may be provided on a bottom surface of the lower substrate 110, and outer connection bumps 117 may be provided under the outer connection pads 116, respectively. The outer connection bumps 117 may electrically connect the lower semiconductor chip 120 and/or an upper semiconductor chip 220 to an external device (not shown). In some embodiments, the lower substrate 110 may comprise, for example, a printed circuit board (PCB) with circuit patterns or other suitable substrate material or configuration.

In some embodiments, the lower semiconductor chip 120 may be mounted on the lower substrate 110 and may be electrically connected to the lower substrate 110. As an example, the lower semiconductor chip 120 may be electrically connected to the lower chip pads 112 of the lower substrate 110 via the lower chip bumps 113. In some embodiments, the lower semiconductor chip 120 may include integrated circuits, for example, in some embodiments, logic circuits.

In some embodiments, the lower mold layer 130 may be provided to cover or coat a side surface of the lower semiconductor chip 120 and the top surface of the lower substrate 110. The lower mold layer 130 may further be provided between the lower semiconductor chip 120 and the lower substrate 110 to fill gap regions between the lower chip bumps 113. In some embodiments, the lower mold layer 130 may have a top surface that is substantially coplanar with that of the lower semiconductor chip 120, and thus, a top surface of the lower semiconductor chip 120 may be exposed by the lower mold layer 130. Alternatively, in other embodiments, the lower mold layer 130 may have a top surface that is higher than that of the lower semiconductor chip 120, and in this case, the lower semiconductor chip 120 may be covered or coated by the lower mold layer 130. In some embodiments, the lower mold layer 130 may be provided to have openings 130a within which, or through which, the connection members 300 are positioned. In some embodiments, the lower mold layer 130 may comprise an insulating polymer material, for example, in some embodiments, an epoxy molding compound, or other suitable material.

In some embodiments, the upper package 200 may be provided on the lower package 100 and may include an upper substrate 210, an upper semiconductor chip 220, an upper mold layer 230, and a through hole TH.

In some embodiments, the upper substrate 210 may include upper chip pads 212 and upper connection pads 214. The upper chip pads 212 may be provided on a top surface of the upper substrate 210, and the upper connection pads 214 may be provided on a bottom surface of the upper substrate 210. The upper connection pads 214 may be provided at the same position of a corresponding one of the lower connection pads 114 when viewed from the top, i.e. a plan view. In this manner, the upper connection pads 214 can be vertically aligned with the lower connection pads 114, respectively. In some embodiments, the upper substrate 210 may comprise, for example, a printed circuit board (PCB) with circuit patterns, or other suitable substrate configuration.

In some embodiments, the upper semiconductor chip 220 may be mounted on the upper substrate 210. In example embodiments, one or more upper semiconductor chips 220 may be mounted on the upper substrate 210. For example, the upper semiconductor chip 220 may include multiple upper semiconductor chips. In the present example embodiment shown the upper semiconductor chip 220 may include a first upper semiconductor chip 221 and a second upper semiconductor chip 226, which are spaced apart from each other. The upper semiconductor chip 220 may be electrically connected to the upper substrate 210. For example, the first and second upper semiconductor chips 221 and 226 may be electrically connected to the upper chip pads 212 through bonding wires 223 and 228, respectively. In this case, each of the first and second upper semiconductor chips 221 and 226 may be attached, or otherwise adhered, to the upper substrate 210 by an adhesive layer 222. Alternatively, the first upper semiconductor chip 221 and/or the second upper semiconductor chip 223 may be electrically connected to the upper substrate 210 using a die bonding or flip-chip bonding technology, or other suitable bonding technology. In some embodiments, the upper semiconductor chip 220 may include integrated circuits (e.g., memory circuits).

The upper mold layer 230 may be provided to cover or coat top surfaces of the upper semiconductor chip 220 and the upper substrate 210. In some embodiments, the upper mold layer 230 may further cover or coat sidewall surfaces of the upper semiconductor chip 220 and the upper substrate 210. In some embodiments, the upper mold layer 230 may include an insulating polymer material (e.g., epoxy molding compound).

A through hole TH may be provided to penetrate through a top surface of the upper package 200 to a bottom surface of the upper package 200. When viewed from the top, or plan view, the through hole TH may be provided at a position that is spaced apart from the upper semiconductor chip 220. For example, the through hole TH may be provided that penetrates the upper substrate 210 and the upper mold layer 230 but that does not penetrate the upper semiconductor chip 220. As an example, in the case where the upper semiconductor chip 220 is configured to include the first and second upper semiconductor chips 221 and 226, the through hole TH may be provided to penetrate the upper substrate 210 and the upper mold layer 230 between the first and second upper semiconductor chips 221 and 226, as shown in FIG. 1. The through hole TH may be overlapped with the lower semiconductor chip 120 when viewed in a plan view. In other words, the through hole TH may be on or above a portion of the lower semiconductor chip 120. In some embodiments, the through hole TH may be positioned at in an inner region, or intermediate region, of the upper package 200. In this case, the through hole TH is spaced apart from an edge or sidewall of the upper package 200.

When viewed from the top or plan view, the through hole TH may have a circular or generally round cross-sectional shape with a diameter of several hundreds μm to several mm; however, other cross-sectional shapes and dimensions are equally applicable to the principles of the present inventive concepts.

In some embodiments, one or more through holes TH may be provided. For example, in some embodiments, the through hole TH may include first and second through holes TH1 and TH2. In the case where the upper semiconductor chip 220 includes the first and second upper semiconductor chips 221 and 226, the first and second through holes TH1 and TH2 may be positioned between the first and second upper semiconductor chips 221 and 226 and parallel to opposite side surfaces of the first and second upper semiconductor chips 221 and 226, as shown in FIG. 2.

In some embodiments, the connection members 300 may be positioned between a corresponding pair of the lower and upper connection pads 114 and 214 to connect the lower package 100 electrically to the upper package 200. In some embodiments, the connection members 300 may be of sufficient thickness in the vertical direction to prevent the upper and lower packages 200 and 100 from being bent. In other words, the connection members 300 are of a sufficient height such that the upper package 200 and the lower package 100 may be vertically separated from each other, thereby forming an empty space or void V (see FIGS. 7 and 8) therebetween, and the connection members 300 may be of a sufficient height so as to support the upper package 200 so that it is positioned above, and spaced apart from, the lower package 100.

In some embodiments, a first heat transmission part 410 may be interposed between the lower package 100 and the upper package 200. In some embodiments, the first heat transmission part 410 may be provided to fill at least a portion of the empty space between the lower and upper packages 100 and 200. Accordingly, the first heat transmission part 410 may be in contact with the top surface of the lower package 100 and a bottom surface of the upper package 200. In the case where the top surface of the lower semiconductor chip 120 is exposed, the first heat transmission part 410 may be provided to cover the entire top surface of the lower semiconductor chip 120. Alternatively, the first heat transmission part 410 may be provided to cover at least a portion of the top surface of the lower semiconductor chip 120. As another example, in the case where the lower semiconductor chip 120 is covered with the mold layer 130, the first heat transmission part 410 may be provided on the mold layer 130 to veil the entire top surface of the lower semiconductor chip 120. In certain embodiments, the first heat transmission part 410 may be provided on the mold layer 130 to veil at least a portion of the lower semiconductor chip 120. In some embodiments, the first heat transmission part 410 may include a thermal interface material (TIM), the thermal conductivity of which is higher than that of the air.

In some embodiments, a second heat transmission part 420 may be provided to fill the through hole TH and may be physically connected to, or otherwise in thermal communication with, the first heat transmission part 410. In some embodiments, the second heat transmission part 420 may be in contact with the upper package 200 through an inner side surface of the through hole TH. In some embodiments, the second heat transmission part 420 may include a thermal interface material (TIM), a thermal conductivity of which is higher than that of the air. In the case where a plurality of the through holes TH are provided, the second heat transmission part 420 may comprise multiple segments, each segment being provided to fill one of the through holes TH and each segment in thermal communication with the first heat transmission part 410.

In some embodiments, the first heat transmission part 410 may comprise multiple independent segments, each in thermal communication with a region of the lower chip 120 or lower mold layer 130. In this example, the second heat transmission part 420 may likewise comprise multiple independent segments, each in thermal communication with at least one of the multiple segments of the first heat transmission part 410.

According to example embodiments of the inventive concepts, heat generated by the lower semiconductor chip 120 may be dissipated into the upper package 200 through the first and second heat transmission parts 410 and 420. In this manner, it is possible to improve performance and operational stability of the lower semiconductor chip 120.

FIGS. 4 through 9 are cross-sectional views taken along section line I-I' of FIG. 1 or 2 to illustrate a method of fabricating a semiconductor package, according to example embodiments of the inventive concept.

Figure 4:
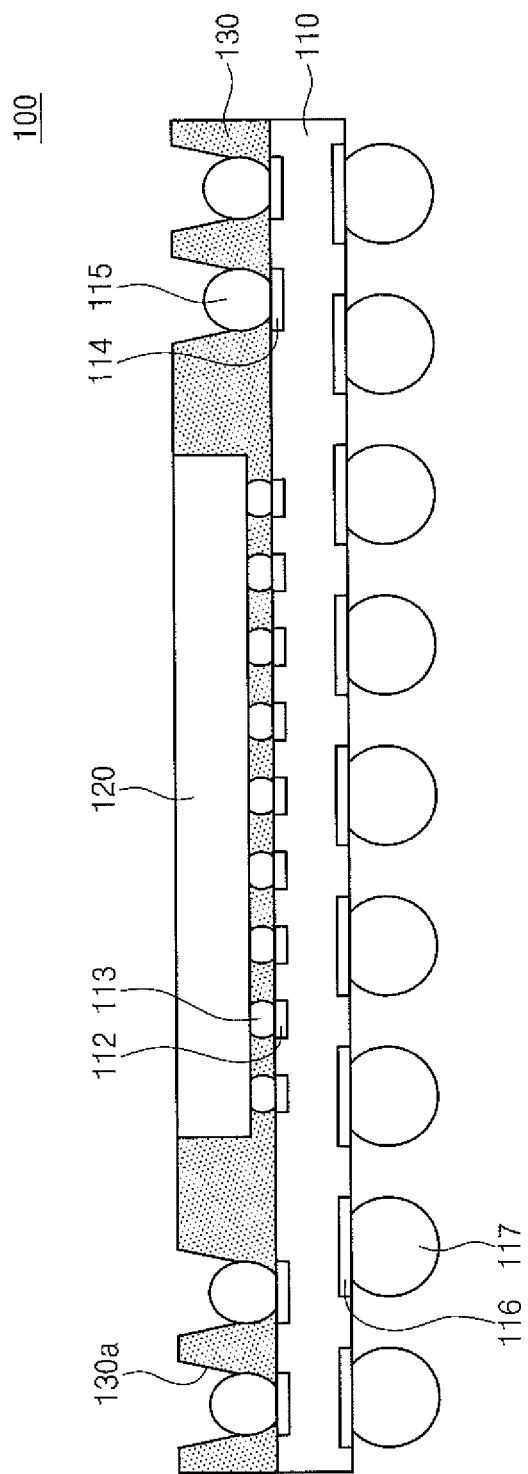
FIGS. 4 through 9 are sectional views taken along line I-I' of FIG. 1 or 2 to illustrate a method of fabricating a semiconductor package, according to example embodiments of the inventive concepts.

Referring to FIG. 4, the lower package 100 may be provided. The lower package 100 may include the lower substrate 110, the lower semiconductor chip 120, and the lower mold layer 130.

The lower substrate 110 may include the lower chip pads 112, the lower connection pads 114, and the outer connection pads 116. The lower chip pads 112 may be found on a central, or intermediate, region of the top surface of the lower substrate 110, and lower chip bumps 113 may be provided on the lower chip pads 112, respectively. The lower connection pads 114 may be formed on an edge, or outer, region of the top surface of the lower substrate 110, and one or more lower solder balls 115 may be formed on the lower connection pads 114, respectively. The outer connection pads 116 may be formed on the bottom surface of the lower substrate 110, and outer connection bumps 117 may be formed under the outer connection pads 116, respectively. The lower substrate 110 may comprise, for example, a printed circuit board (PCB) with circuit patterns, or other suitable substrate configuration.

The lower semiconductor chip 120 may be mounted on the lower substrate 110. The lower semiconductor chip 120 may be electrically connected to the lower substrate 110. As an example, the lower semiconductor chip 120 may be electrically connected to the lower chip pads 112 via the lower chip bumps 113. In some embodiments, the lower semiconductor chip 120 may include integrated circuits, for example, integrated logic circuits or integrated analog circuits.

In some embodiments, the lower mold layer 130 may be formed to cover a side surface of the lower semiconductor chip 120 and the top surface of the lower substrate 110. In some embodiments, the lower mold layer 130 may fill gaps between the lower solder balls 115. The lower mold layer 130 may further be formed between the lower semiconductor chip 120 and the lower substrate 110 to fill gap regions between the lower chip pads 113. In some embodiments, the lower mold layer 130 may be formed to have a top surface that is substantially coplanar with that of the lower semiconductor chip 120 and expose a top surface of the lower semiconductor chip 120. Alternatively, the lower mold layer 130 may be formed to have a top surface that is higher than that of the lower semiconductor chip 120, so that a portion of the lower mold layer is positioned on or above the lower semiconductor chip 120, accordingly the lower semiconductor chip 120 may be covered by a portion of the lower mold layer 130. In some embodiments, the lower mold layer 130 may be formed to define the openings 130a exposing the lower solder balls 115. In example embodiments, a drilling process may be performed to partially remove the lower mold layer 130 such that the openings 130a may be formed to expose the lower solder balls 115. In some embodiments, the lower mold layer 130 may include an insulating polymer material, for example a epoxy molding compound, or other suitable material.

Figure 5:
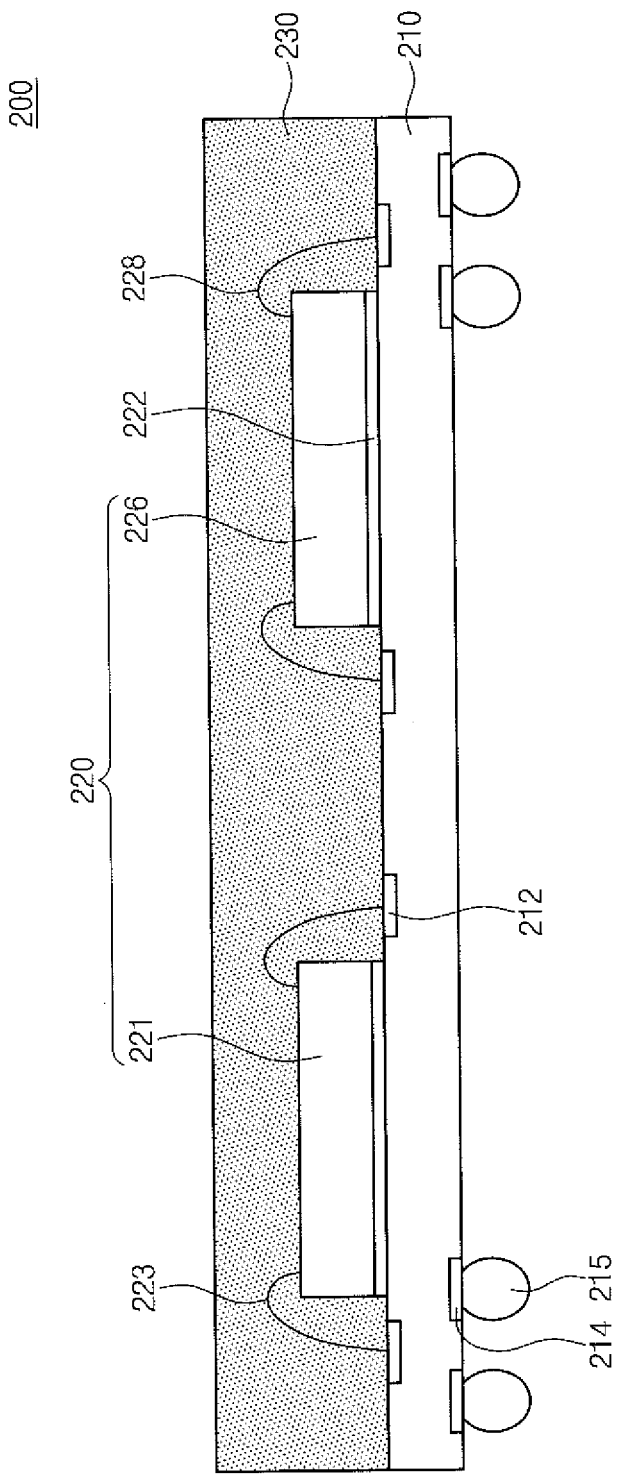

Referring to FIG. 5, the upper package 200 may be provided. The upper package 200 may include the upper substrate 210, the upper semiconductor chip 220, and the upper mold layer 230.

In some embodiments, the upper substrate 210 may include the upper chip pads 212 and the upper connection pads 214. The upper chip pads 212 may be formed on a top surface of the upper substrate 210. The upper connection pads 214 may be formed on a bottom surface of the upper substrate 210, and upper solder balls 215 may be formed under the upper connection pads 214, respectively. The upper substrate 210 may comprise, for example, a printed circuit board (PCB) with circuit patterns, or other suitable substrate material.

The upper semiconductor chip 220 may be mounted on the upper substrate 210. In example embodiments, one or more upper semiconductor chips 220 may be mounted on the upper substrate 210. For example, the upper semiconductor chip 220 may include a first upper semiconductor chip 221 and a second upper semiconductor chip 226, which are spaced apart from each other. In some embodiments, the upper semiconductor chip can include three or more semiconductor chips. For purposes of the present disclosure, two semiconductor chips 221, 226 are shown. The upper semiconductor chip 220 may be electrically connected to the upper substrate 210. For example, the first and second upper semiconductor chips 221 and 226 may be electrically connected to the upper chip pads 212 through bonding wires 223 and 228, respectively. In this case, each of the first and second upper semiconductor chips 221 and 226 may be attached to the upper substrate 210 by an adhesive layer 222. Alternatively, the first upper semiconductor chip 221 and/or the second upper semiconductor chip 223 may be electrically connected to the upper substrate 210 using a die bonding or flip-chip bonding technology, or other suitable bonding technology. The upper semiconductor chip 220 may include integrated circuits (e.g., memory circuits) which may comprise digital logic circuits or analog circuits.

The upper mold layer 230 may be formed to cover top surfaces of the upper semiconductor chip 220 and the upper substrate 210. In some embodiments, the upper mold layer 230 may include an insulating polymer material (e.g., epoxy molding compound), or other suitable material.

Figure 6:
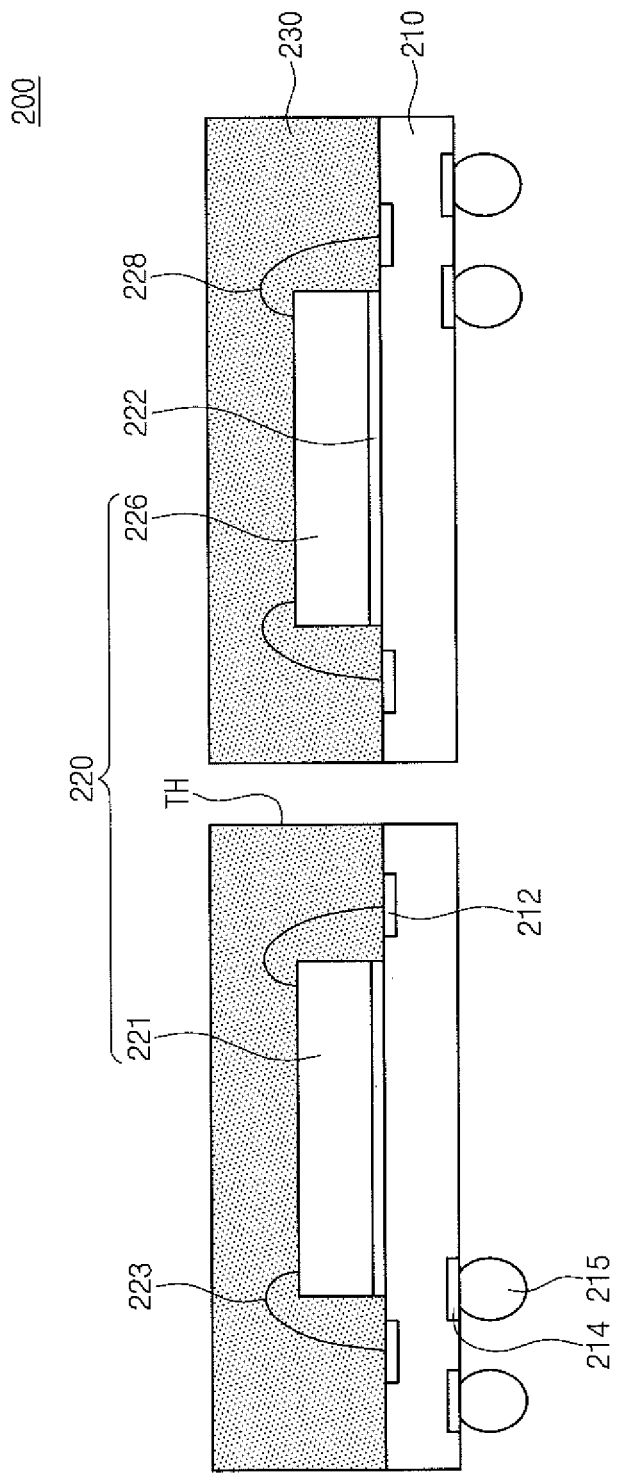

Referring to FIG. 6, the through hole TH may be formed to penetrate the upper package 200 from top to bottom. The through hole TH may be formed using a laser drilling or mechanical drilling process. When viewed from a top orientation, or plan view, the through hole TH may be formed at a position that is laterally spaced apart from the upper semiconductor chip 220. For example, the through hole TH may be formed to penetrate the upper substrate 210 and the upper mold layer 230. As an example, in the case where the upper semiconductor chip 220 includes the first and second upper semiconductor chips 221 and 226, the through hole TH may be formed between the first and second upper semiconductor chips 221 and 226, as shown in FIGS. 1 and 6. Further, a position of the through hole TH may be selected to be overlapped with, or above, the lower semiconductor chip 120 of the lower package 100, when the upper package 200 is electrically connected to the lower package 100 in a subsequent process. In addition, when viewed from a top orientation, or plan view, the through hole TH may be formed in the upper package 200 (i.e., spaced apart from the edge of the upper package 200). When viewed from the top orientation, or plan view, the through hole TH may have a circular cross-sectional shape with a diameter of several hundreds μm to several mm; however, other cross-sectional shapes and dimensions are equally applicable to the principles of the present inventive concepts.

In example embodiments, one or more through holes TH may be provided. For example, the through hole TH may include first and second through holes TH1 and TH2, as shown by way of example in FIG. 2. In the case where the upper semiconductor chip 220 includes the first and second upper semiconductor chips 221 and 226, the first and second through holes TH1 and TH2 may be provided between the first and second upper semiconductor chips 221 and 226 and parallel to opposite side surfaces of the first and second upper semiconductor chips 221 and 226, as shown in FIG. 2. In some embodiments, more than two through holes TH may be employed.

Figure 7:
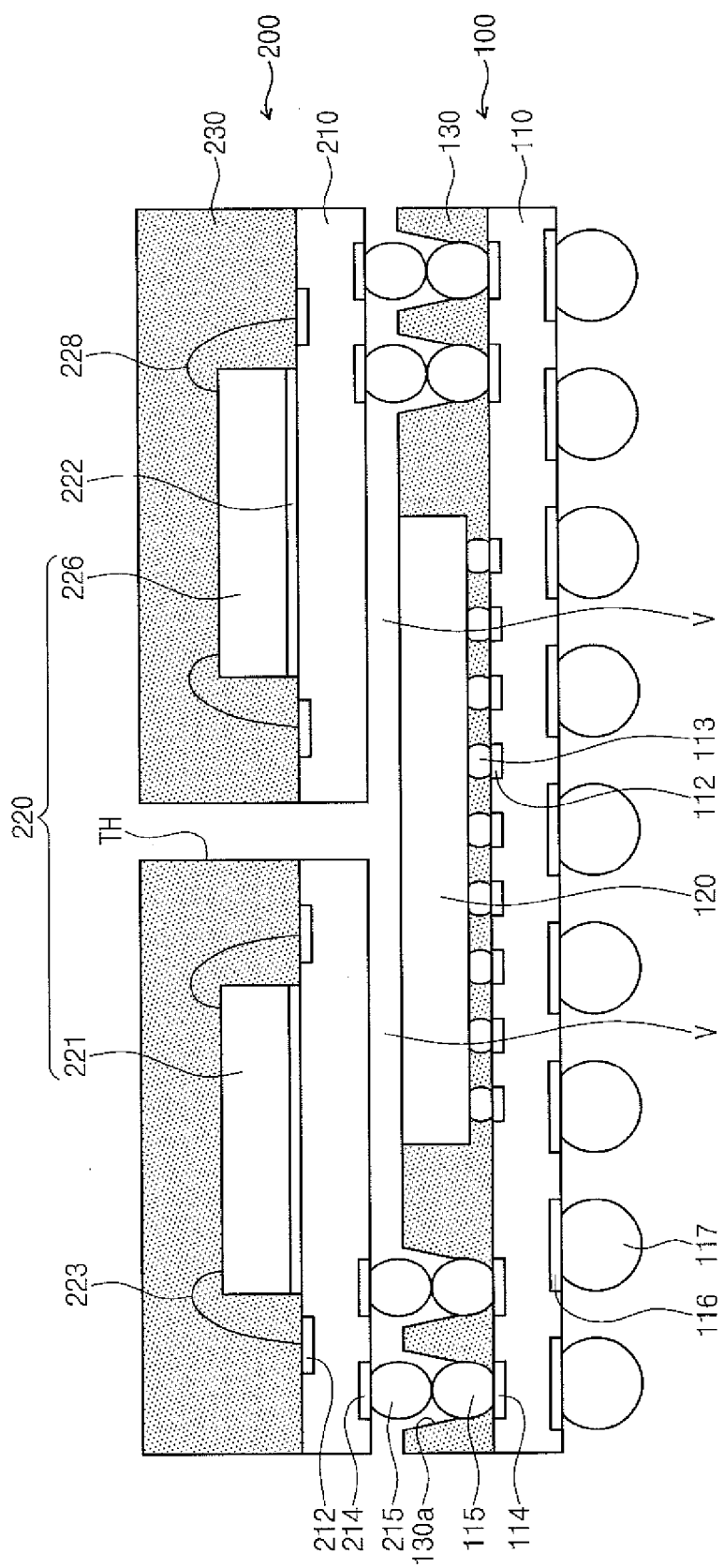

Referring to FIG. 7, the upper package 200 may be stacked on the lower package 100. For example, the upper package 200 may be positioned on the lower package 100 in such a way that the upper solder balls 215 are aligned with the lower solder balls 115, respectively. In some embodiments, the upper solder balls 215 are in direct physical contact with the lower solder balls 115 in condition that the upper package 200 is vertically spaced apart from the lower package 100. In some embodiments, a void V is present between a lowermost portion of the upper package 200 and an uppermost portion of the lower package 100. In some embodiments, the void V is oriented horizontally between the upper package 200 and lower package 100. In some embodiments, a single solder ball 115 or 215 may be used for the purpose of spacing apart the upper package 200 and lower package 100, rather than two stacked solder balls 115, 215, as shown in the embodiment of FIG. 7.

Figure 8:
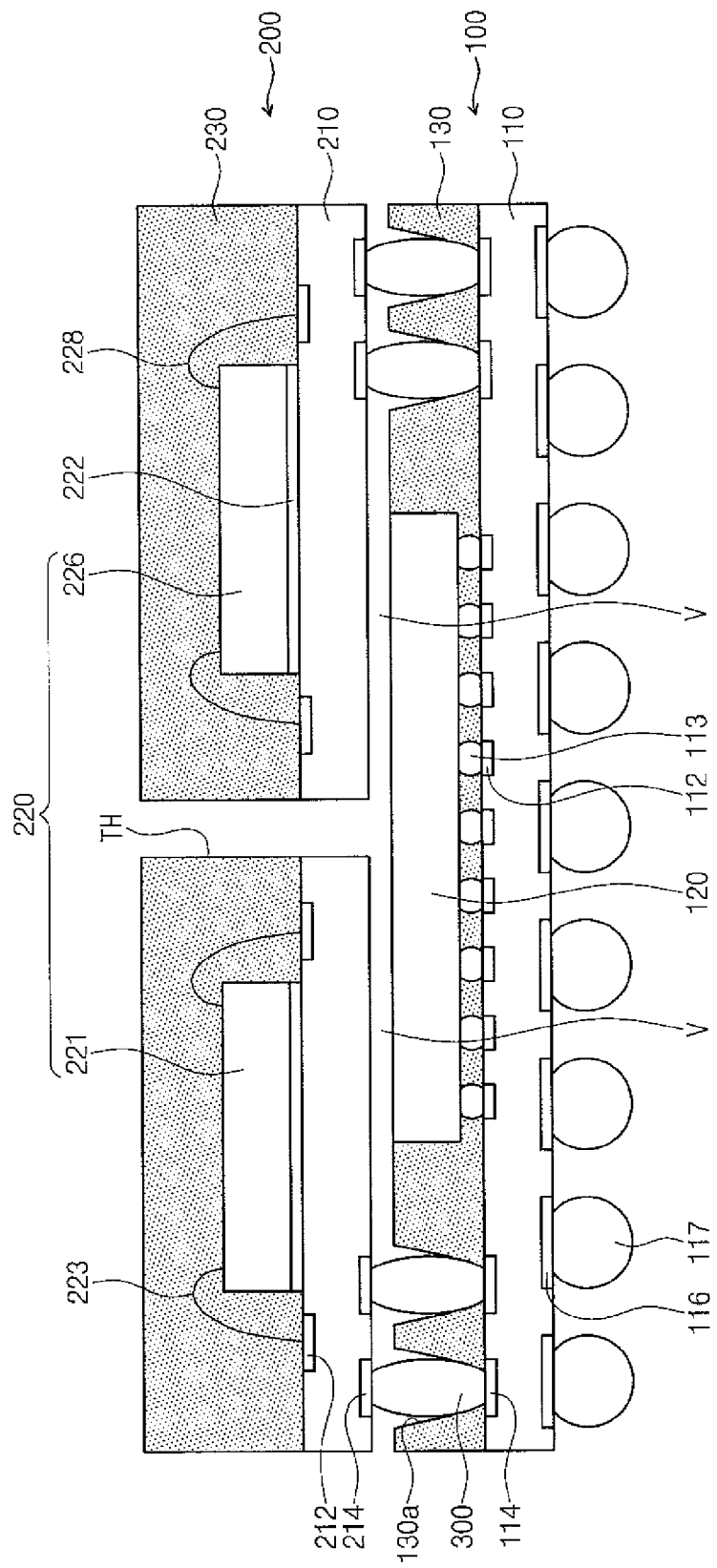

Referring to FIG. 8, the upper package 200 may be electrically connected to the lower package 100. The electrical connection between the upper and lower packages 200 and 100 may include welding the upper and lower solder balls 215 and 115 to form the connection members 300. In other words, the upper connection pads 214 may be electrically connected to the lower connection pads 114, respectively, through the connection members 300. The connection members 300 may be thick enough to prevent the upper and lower packages 200 and 100 from being bent. As a result, the upper package 200 and the lower package 100 may be vertically separated from each other, thereby forming an empty space, or void V therebetween.

Figure 9:
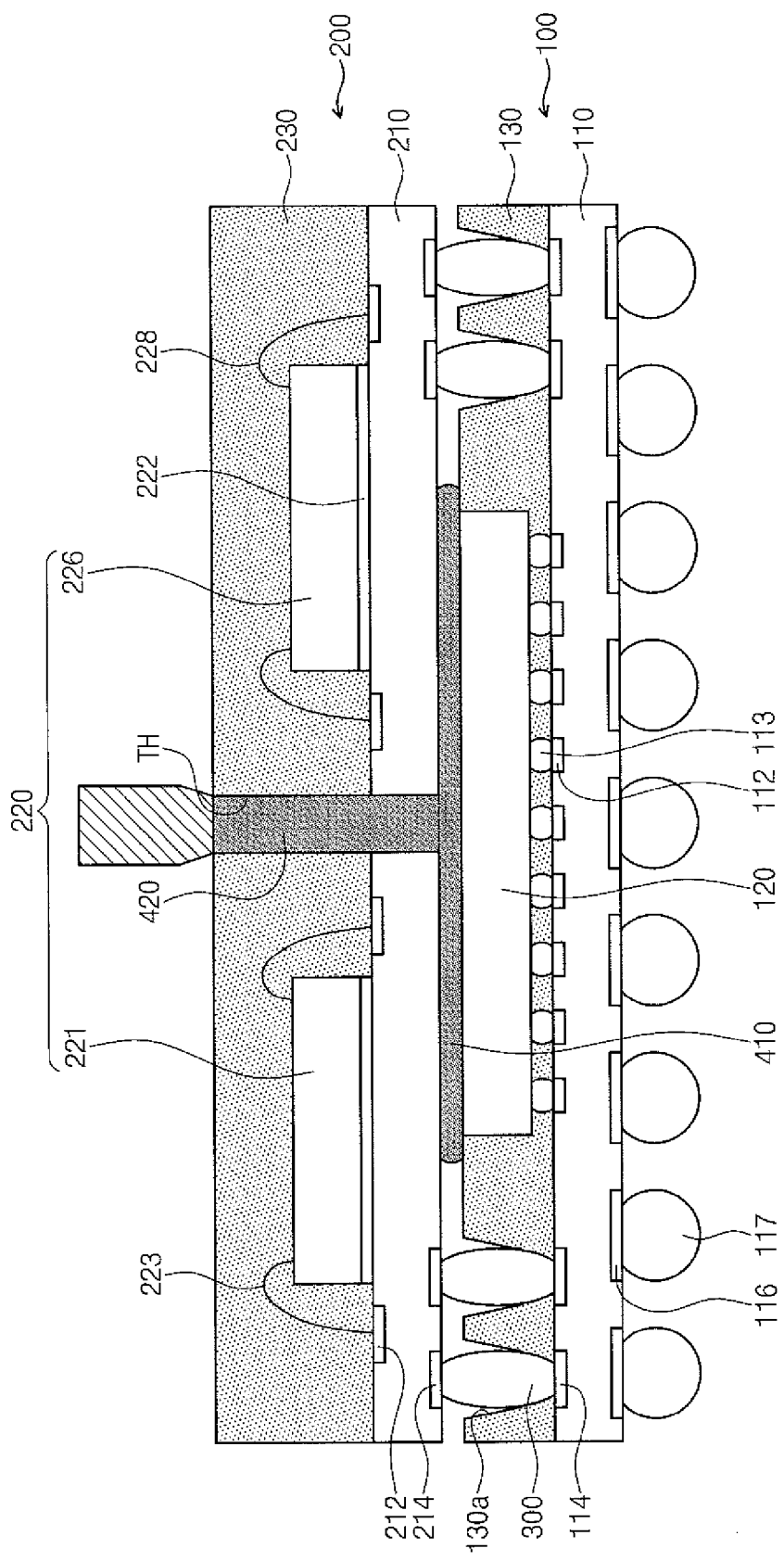

Referring to FIG. 9, a thermal interface material (TIM) may be injected into the through hole TH to form the first heat transmission part 410 interposed between the upper package 200 and the lower package 100 and the second heat transmission part 420 extending from the first heat transmission part 410 to fill the through hole TH. In example embodiments, pressure may be applied to the thermal interface material, when the thermal interface material is injected into the through hole TH. In the case where a plurality of through holes TH are formed, the thermal interface material may be simultaneously, or consecutively, injected to all of the through holes TH. Due to the applied pressure and the capillary phenomenon, the thermal interface material injected to the through hole TH may be flowed to fill the empty space between the upper package 200 and the lower package 100, thereby forming the first heat transmission part 410. In some embodiments, the first heat transmission part 410 may be formed to be in contact with the top surface of the lower package 100 and the bottom surface of the upper package 200. In some embodiments, the first heat transmission part 410 extends in a horizontal direction in the void V between the lower package 100 and upper package 200, while the second heat transmission part 420 extends in the vertical direction through the upper package 200. In the case where the top surface of the lower semiconductor chip 120 is exposed to the void region V, the first heat transmission part 410 may be formed to cover the entire top surface of the lower semiconductor chip 120. In certain embodiments, the first heat transmission part 410 may be formed to cover at least a portion of the top surface of the lower semiconductor chip 120. As another example, in the case where the lower semiconductor chip 120 is covered with the mold layer 130, the first heat transmission part 410 may be formed on the mold layer 130 to veil the entire top surface of the lower semiconductor chip 120. In certain embodiments, the first heat transmission part 410 may be formed on the mold layer 130 to veil at least a portion of to the lower semiconductor chip 120. The second heat transmission part 420 may be formed to fill the through hole TH and thus may be in contact with the upper package 200. The thermal interface material may be formed of a material having a thermal conductivity that is higher than that of the air.

According to example embodiments of the inventive concept, heat generated from the lower semiconductor chip 120 may be dissipated into the upper package 200 through the first and second heat transmission parts 410 and 420, and this makes it possible to improve performance and operational stability of the lower semiconductor chip 120.

In the case where a heat transmission part is formed on a lower package and then an upper package is stacked thereon, due to the presence of the heat transmission part, there can be difficulty in connecting the upper solder balls to the lower solder balls or in connecting the upper package to the lower package. For example, non-wet phenomenon may occur, leading to reduced thermal contact.

By contrast, according to example embodiments of the inventive concept, the upper package 200 is mounted on the lower package 100, and then, the heat transmission parts 410 and 420 is formed between the lower and upper packages 100 and 200, and thus, it is possible to prevent the non-wet phenomenon from occurring. In other words, when compared with the conventional package-on-package process, it is possible to fabricate a semiconductor package with improved thermal characteristics by adding only two steps, e.g., of forming the through hole and of injecting the thermal interface material into the through hole.

Figure 10:
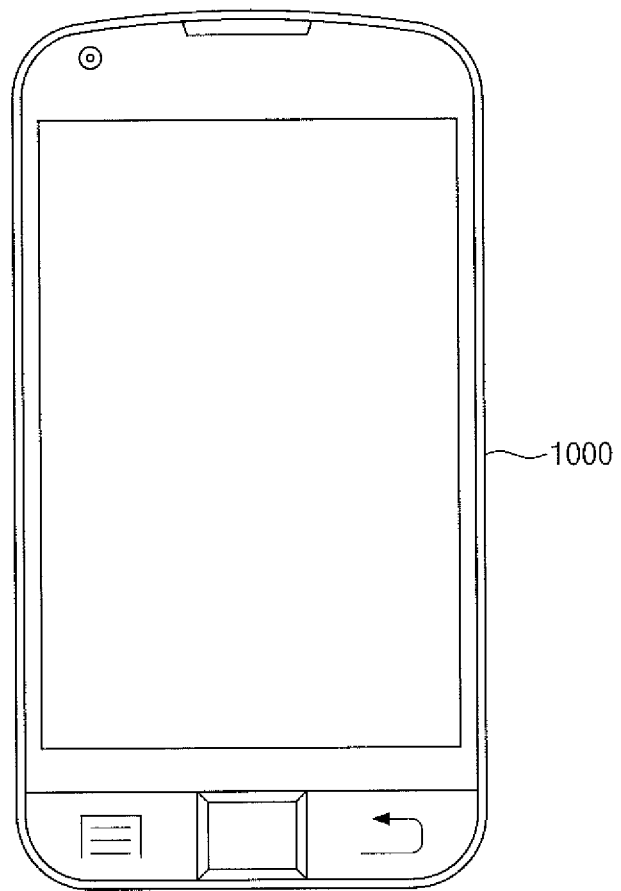
FIG. 10 is a diagram illustrating an example of electronic devices including a semiconductor package according to example embodiments of the inventive concepts.

FIG. 10 is a diagram illustrating an example of electronic devices including a semiconductor package according to example embodiments of the inventive concepts.

Referring to FIG. 10, the semiconductor package according to example embodiments of the inventive concepts may be used to realize a mobile phone 1000. Alternatively, the semiconductor package according to example embodiments of the inventive concept may be used to realize a smart phone, a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit information data wirelessly.

Figure 11:
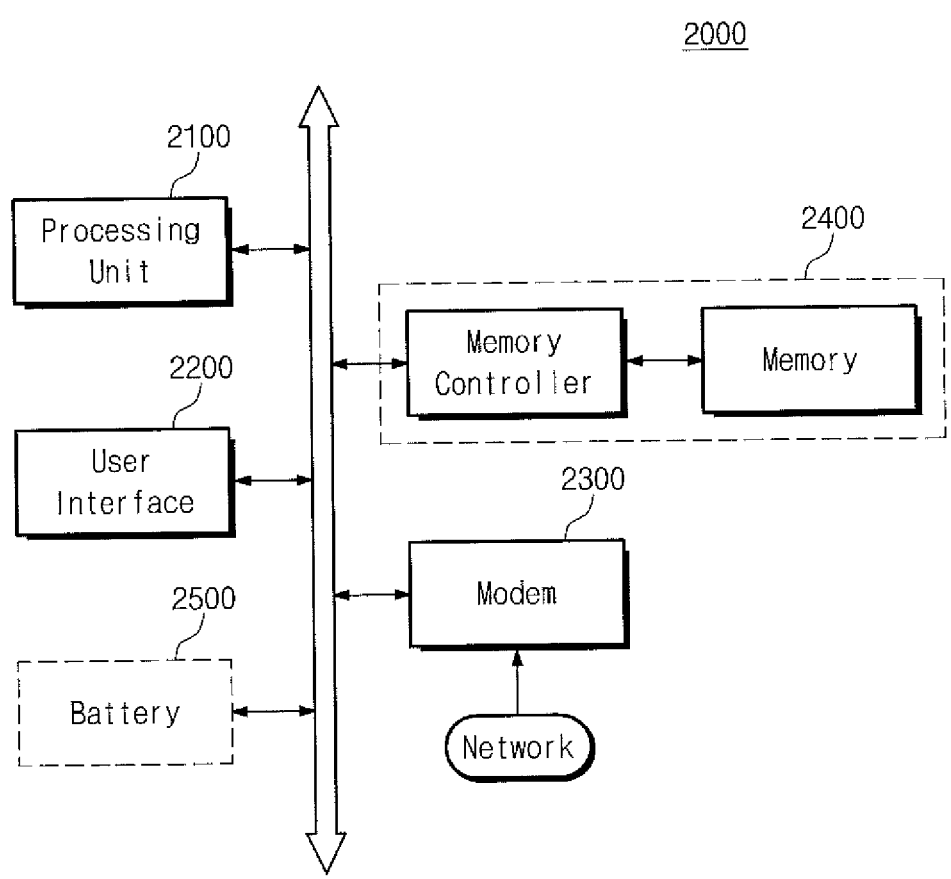
FIG. 11 is a schematic block diagram illustrating an example of electronic systems including a semiconductor package according to example embodiments of the inventive concept.

FIG. 11 is a schematic block diagram illustrating an example of electronic systems including a semiconductor package according to example embodiments of the inventive concept.

Referring to FIG. 11, an electronic device 2000 according to example embodiments of the inventive concept may include a micro-processor 2100, a user interface 2200, and a semiconductor package 2400, which may be configured to have the same features as one of the semiconductor packages according to example embodiments of the inventive concepts. For example, the semiconductor package 2400 may include a memory controller corresponding to the lower semiconductor chip 120 of FIG. 3 and a memory corresponding to the upper semiconductor chip 220. Alternatively, the semiconductor package 2400 may correspond to the semiconductor package of FIG. 3.

In the case where the electronic device 2000 is provided for the mobile application, the electronic device 2000 may further include a battery 2500. Further, the electronic device

2000 may further include a modem 2300 (e.g., a baseband chipset). In addition, although not shown, the electronic device 2000 may further include other electronic components, such as an application chipset and a camera image processor (CIS), as will be obvious to skilled persons in the art.

According to example embodiments of the inventive concepts, heat generated from a lower semiconductor chip can be effectively dissipated into an upper package, and this makes it possible to improve operational stability of the lower semiconductor chip.

According to example embodiments of the inventive concept, heat transmission parts may be formed after forming electrical connection members connecting an upper package to a lower package, and thus, it is possible to improve reliability in electric connection between the upper and lower packages.

According to example embodiments of the inventive concept, by adding as few as two steps, e.g., of forming the through hole and of injecting the thermal interface material into the through hole, it is possible to realize a semiconductor package with improved thermal characteristics, as compared with the conventional package-on-package process.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor package, the method comprising:
   providing a lower package with a lower substrate, a lower semiconductor chip, and a lower mold layer;
   providing an upper package with an upper substrate, an upper semiconductor chip, and an upper mold layer;
   forming a through hole to penetrate the upper package;
   electrically connecting the upper package to the lower package; and
   injecting a thermal interface material into the through hole to form a first heat transmission part between, and in contact with, the upper package and the lower package.

2. The method of claim 1, wherein the injecting of the thermal interface material further comprises forming a second heat transmission part extending from the first heat transmission part to fill the through hole.

3. The method of claim 1, wherein the first heat transmission part is formed to be in contact with the upper package and the lower package.

4. The method of claim 1, wherein the lower mold layer is formed to cover a side surface of the lower semiconductor chip and have a top surface substantially coplanar with that of the lower semiconductor chip, and
   wherein the first heat transmission part is formed to cover at least a portion of the top surface of the lower semiconductor chip.

5. The method of claim 1, wherein the through hole is formed at a position that is laterally spaced apart from an edge of the upper package in plan view.

6. The method of claim 1, wherein the through hole is formed above the lower semiconductor chip in plan view.

7. The method of claim 1, wherein the providing of the upper package comprises mounting the upper semiconductor chip on the upper substrate, and
   wherein the through hole is formed spaced apart from the upper semiconductor chip.

8. The method of claim 1, wherein the upper semiconductor chip comprises first and second upper semiconductor chips spaced apart from each other, and
   wherein the through hole is formed between the first and second upper semiconductor chips.

9. The method of claim 8, wherein the through hole comprises first and second through holes arranged parallel to opposite side surfaces of the first and second upper semiconductor chips.

10. A method of fabricating a semiconductor package, the method comprising:
    providing a lower package with a lower substrate, a lower semiconductor chip, and a lower mold layer;
    providing an upper package with an upper substrate, an upper semiconductor chip, and an upper mold layer;
    forming a through hole through the upper package;
    positioning the upper package on the lower package with connection members between electrical contacts of the upper package and electrical contacts of the lower package, the connection members being of a height to form a void between a lowermost surface of the upper mold layer of the upper package and an uppermost surface of at least one of the lower semiconductor chip or lower mold layer of the lower package, the void extending in an horizontal direction between the lower package and upper package; and
    after positioning the upper package on the lower package, injecting a thermal interface material into the through hole to form a first heat transmission part in the void in contact with the lower package and upper package.

11. The method of claim 10 wherein injecting the thermal interface material further fills the through hole with the thermal interface material.

12. The method of claim 10 wherein the upper semiconductor chip comprises first and second upper semiconductor chips and wherein the through hole is between, and laterally spaced apart from the first and second upper semiconductor chips.

13. The method of claim 10 wherein the through hole is above the lower semiconductor chip or wherein the through hole comprises multiple through holes.

14. The method of claim 10 wherein the lower mold layer surrounds, in a lateral direction, the lower semiconductor chip and surrounds, in a lateral direction, the connection members.

* * * * *